US012610488B2

(12) United States Patent
Li et al.

(10) Patent No.: US 12,610,488 B2
(45) Date of Patent: Apr. 21, 2026

(54) DEVICE TO PREVENT LED MODULE FROM BEING SLIPPED DOWNWARD AND ASSEMBLY METHODS

(71) Applicant: Superpixel Electronics Co LTD, Shenzhen (CN)

(72) Inventors: Sheng Li, Shenzhen (CN); Lei Liang, Shenzhen (CN); Youhe Zhang, Shenzhen (CN); Shengxu Huang, Shenzhen (CN)

( * ) Notice: Subject to any disclaimer, the term of this patent is extended or adjusted under 35 U.S.C. 154(b) by 413 days.

(21) Appl. No.: 18/490,838

(22) Filed: Oct. 20, 2023

(65) Prior Publication Data

US 2025/0133674 A1      Apr. 24, 2025

(51) Int. Cl.
*H05K 5/30*         (2025.01)
*G09F 9/30*         (2006.01)

(52) U.S. Cl.
CPC ................. *H05K 5/30* (2025.01); *G09F 9/30* (2013.01)

(58) Field of Classification Search
CPC ................................... H05K 5/30; G09F 9/30
USPC ................................ 361/731, 807, 809, 810
See application file for complete search history.

(56) References Cited

U.S. PATENT DOCUMENTS

2008/0083865 A1* 4/2008 Matsui ................... F16M 11/10
                                                                 248/496
2014/0078685 A1* 3/2014 Lee ....................... G09F 9/3026
                                                                 361/730
2021/0076115 A1* 3/2021 Choi ...................... H04R 1/028
2021/0080053 A1* 3/2021 Kim ....................... F16M 13/02

FOREIGN PATENT DOCUMENTS

CN      205048112 U  *  2/2016   ............. F16M 13/02
CN      115585794 A  *  1/2023   ........... G01C 15/004
CN      219553185 U  *  8/2023   ............. H05K 5/02
KR      101669428 B1 * 10/2016   ............. H04N 5/655

* cited by examiner

*Primary Examiner* — Hung S. Bui
(74) *Attorney, Agent, or Firm* — Daniel M. Cohn; Howard M. Cohn

(57) ABSTRACT

The present disclosure provides a device to prevent LED module from being slipped downward and assembly methods, comprising: a cabinet, a LED module and a plurality of carrier assemblies; the cabinet is made of SPCC and is provided with a plurality of horizontally distributed rectangular-shaped through holes; several magnetic columns are fixedly connected around the periphery of the LED module, and one end of the magnetic column that is far away from the LED module is adsorbed on the cabinet; the carrier assemblies are arranged on the cabinet to carry the magnetic columns to prevent the magnetic columns from being slipped downward due to the influence of LED module gravity or vibration, thus ensuring that the LED module is in the established position, so that the accuracy of the LED display screen is accurate.

10 Claims, 3 Drawing Sheets

DEVICE TO PREVENT LED MODULE FROM BEING SLIPPED DOWNWARD AND ASSEMBLY METHODS

TECHNICAL FIELD

The present disclosure relates to a technical field of LED display screens, and in particular to a device to prevent LED module from being slipped downward and assembly methods.

BACKGROUND

LED display screens are widely used in outdoor displays, monitoring centers, advertising or media displays, and more and more scenes on stage. Generally, it is formed by splicing several LED modules, and a single LED module is easy to slide under the action of gravity or external vibration, which affects the accuracy of the LED display screen formed by splicing.

SUMMARY

The present disclosure provides a device to prevent LED module from being slipped downward and assembly methods, in order to solve the technical problems of the LED module from being slipped downward and complex operation.

The working process of the device to prevent LED module from being slipped downward of the present application is as follows: the device to prevent LED module from being slipped downward, comprising: a cabinet, a LED module and a plurality of carrier assemblies; a cabinet, a LED module and a plurality of carrier assemblies; the cabinet is made of SPCC and is used to adsorb other structures; the cabinet is provided with a plurality of horizontally distributed rectangular-shaped through holes; several magnetic columns are fixedly connected around the periphery of the LED module, and one end of the magnetic column that is far away from the LED module is adsorbed on the cabinet; the LED module is arranged opposite to the rectangular-shaped through holes; each carrier assembly comprises a T-shaped aluminum sheet and a positioning screw; the upper end of the T-shaped aluminum sheet is provided with a fixed slot; the cabinet is equipped with a threaded hole corresponding to the fixed slot; the positioning screw is threaded through the fixed slot and connected with the threaded hole for fixing the T-shaped aluminum sheet on the cabinet, both sides of the lower end of the T-shaped aluminum sheet are located below the two magnetic columns in a horizontal direction on the LED module for avoiding downward sliding of the magnetic columns.

Furthermore, the T-shaped aluminum sheet comprises a connecting plate and a carrier plate integrally formed with the connecting plate, the carrier plate and the connecting plate are perpendicular to each other; the fixed slot is located at one end of the connecting plate away from the carrier plate.

Furthermore, the fixed slot is a long groove arranged along the length direction of the connecting plate.

Furthermore, the connecting plate is located between two magnetic columns along a horizontal direction, one side of the carrier plate facing the connecting plate is in close contact with the two magnetic columns.

Furthermore, the connecting plate is also provided with an auxiliary hole, the auxiliary hole is located between the top of the fixed slot and the connecting plate.

Furthermore, both ends of the carrier plate are in arc shape.

Furthermore, the positioning screw is M3 screw.

Furthermore, the number of the carrier assembly is two, and the two carrier assemblies are respectively located at a perimeter corner above the rectangular-shaped through holes.

An assembly method of the device to prevent LED module from being slipped downward comprising the following steps:

Firstly, attach all required T-shaped aluminum sheets onto the threaded holes on the cabinet with positioning screws; the carrier plate of the T-shaped aluminum sheet is near the rectangular-shaped through hole; secondly, face the LED module towards the rectangular-shaped through hole on the cabinet; then attach the magnetic columns of the LED module to the cabinet, so that both sides of the lower end of the T-shaped aluminum sheet are located below the two adjacent magnetic columns on the upper part of the LED module; thirdly, loosen the positioning screw slightly, insert an auxiliary tool into the auxiliary hole on the T-shaped aluminum sheet and lift it upwards, so that both sides of the lower end of the T-shaped aluminum sheet are in close contact with the two magnetic columns above them; then tighten the positioning screw and fix the T-shaped aluminum sheet to the cabinet stably to ensure that the T-shaped aluminum sheet will not slide downward from the cabinet.

The present disclosure has beneficial effects as follows.

Compared with the existing technology, the present disclosure is provided with the fixed slot on the upper end of the T-shaped aluminum sheet, and the cabinet is provided with the threaded hole corresponding to the fixed slot, so that the positioning screw can be threaded through the fixed slot and the threaded hole. And then the T-shaped aluminum sheet is then fixed on the cabinet. Because both sides of the lower end of the T-shaped aluminum sheet are located below the two magnetic columns in the horizontal direction. And the LED module is magnetically adsorbed on the cabinet through a number of magnetic columns and fixed on the cabinet. Therefore, when the magnetic column slides due to the influence of gravity on the LED module or by external vibration, it will be firmly carried by both sides of the lower end of the T-shaped aluminum sheet. Furthermore, it ensures that the LED modules are always in their corresponding positions, so that the LED display screen formed by the splicing of multiple LED modules is precise and accurate.

BRIEF DESCRIPTION OF DRAWINGS

In order to more clearly illustrate technical solutions in embodiments of the present disclosure, drawings required in description or prior art are briefly introduced below, and obviously, the drawings in the following description are merely some embodiments of the present disclosure. For a person having ordinary skill in art, other drawings may be obtained according to the drawings without creative efforts.

REFERENCE NUMBER IN THE DRAWINGS

Figure 1:
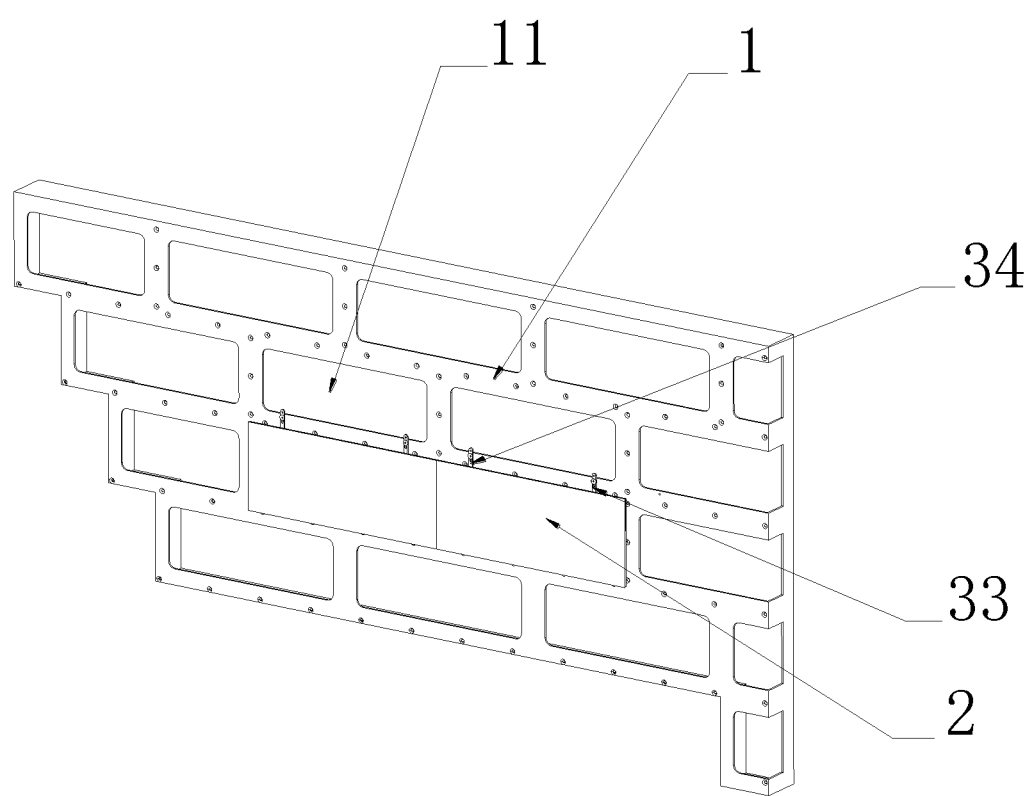
FIG. 1 is a perspective view of a device to prevent LED module from being slipped downward.
Figure 2:
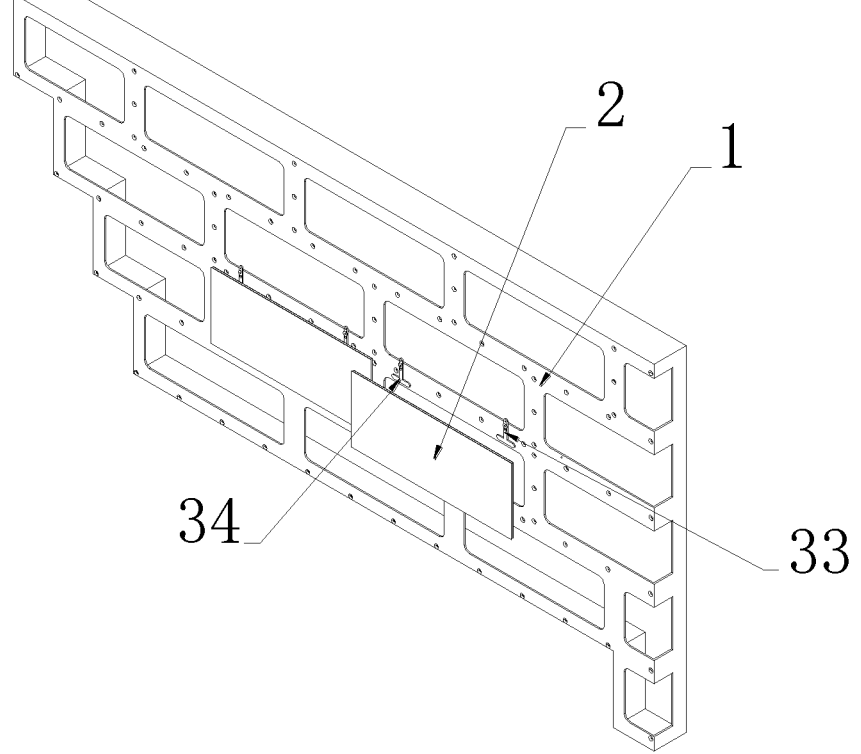
FIG. 2 is another perspective view of the device to prevent LED module from being slipped downward.

| cabinet | 1 | rectangular-shaped through hole | 11 |
| magnetic column | 12 | LED module | 2 |
| carrier assembly | 3 | T-shaped aluminum sheet | 31 |
| connecting plate | 311 | fixed slot | 3111 |
| auxiliary hole | 3112 | carrier plate | 312 |
| positioning screw | 32 | first carrier assembly | 33 |
| second carrier assembly | 34 | | |

DETAILED DESCRIPTION

The following describes in detail the embodiments of the present disclosure, examples of which are illustrated in the accompanying drawings, wherein the same or similar reference numerals refer to the same or similar elements or elements having the same or similar functions throughout. The embodiments described below with reference to the accompanying drawings are exemplary, and are not intended to limit the present disclosure.

In order to make the purpose, technical solutions, and advantages of the present disclosure clear, the following further describes the present disclosure in detail with reference to accompanying drawings and embodiments.

The present disclosure is provided a device to prevent LED module from being slipped downward and assembly methods, which is applied in the field of LED display screens.

Referring to FIG. 1 to FIG. 6, in order to prevent the LED module 2 used to splice the LED display from offsetting the established position, affecting the accuracy of the LED display, the embodiment of the present disclosure provides a device to prevent LED module 2 from being slipped downward, comprising: a cabinet 1, a LED module 2 and a plurality of carrier assemblies 3; the cabinet 1 is made of SPCC and is used to adsorb other structures; the cabinet 1 is provided with a plurality of horizontally distributed rectangular-shaped through holes 11; several magnetic columns 12 are fixedly connected around the periphery of the LED module, and one end of the magnetic column 12 that is far away from the LED module is adsorbed on the cabinet 1; the carrier assemblies 3 are arranged on the cabinet 1 to carry the magnetic columns 12 to prevent the magnetic columns 12 from being slipped downward due to the influence of LED module 2 gravity or vibration, thus ensuring that the LED module 2 is in the established position, so that the accuracy of the LED display screen is accurate.

The mentioned structures are described in detail below.

Figure 3:
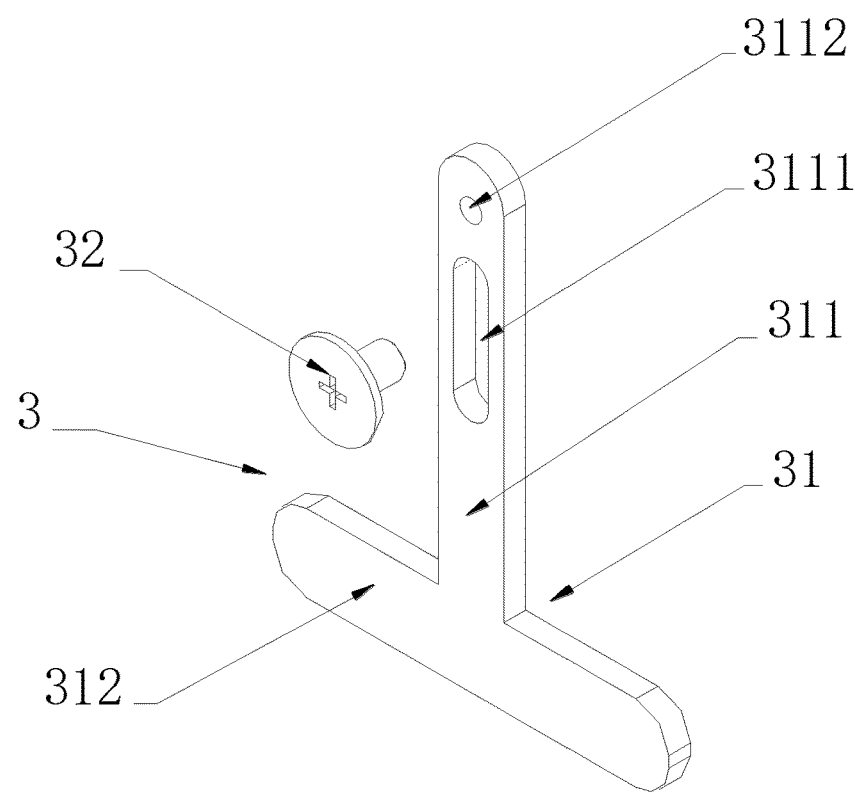
FIG. 3 is an exploded perspective view of a carrier assembly thereof.
Figure 4:
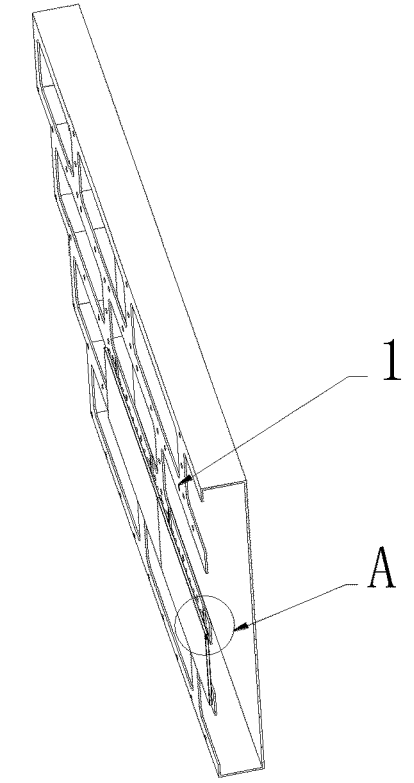
FIG. 4 is a cross-section of the device to prevent LED module from being slipped downward.

Referring to FIG. 1 and FIG. 3, the plurality of carrier assemblies 3 comprises a T-shaped aluminum sheet 31 and a positioning screw 32; the upper end of the T-shaped aluminum sheet 31 is provided with a fixed slot 3111; the cabinet 1 is equipped with a threaded hole corresponding to the fixed slot 3111; the positioning screw 32 is threaded through the fixed slot 3111 and connected with the threaded hole for fixing the T-shaped aluminum sheet 31 on the cabinet 1, both sides of the lower end of the T-shaped aluminum sheet 31 are located below the two magnetic columns 12 in a horizontal direction to avoid the slipped downward of the magnetic columns 12.

Referring to FIG. 3, the T-shaped aluminum sheet 31 comprises a connecting plate 311 and a carrier plate 312 integrally formed with the connecting plate 311, the carrier plate 312 and the connecting plate 311 are perpendicular to each other; the fixed slot 3111 is located at one end of the connecting plate 311 away from the carrier plate 312, wherein the fixed slot 3111 is a long groove arranged along the length direction of the connecting plate 311. The long groove is mainly used to fix the position of the T-shaped aluminum sheet 31.

Furthermore, it should be noted that the connecting plate 311 is located at the upper end of the T-shaped aluminum sheet 31, and the carrier plate 312 is located at the lower end of the T-shaped aluminum sheet 31.

Figure 5:
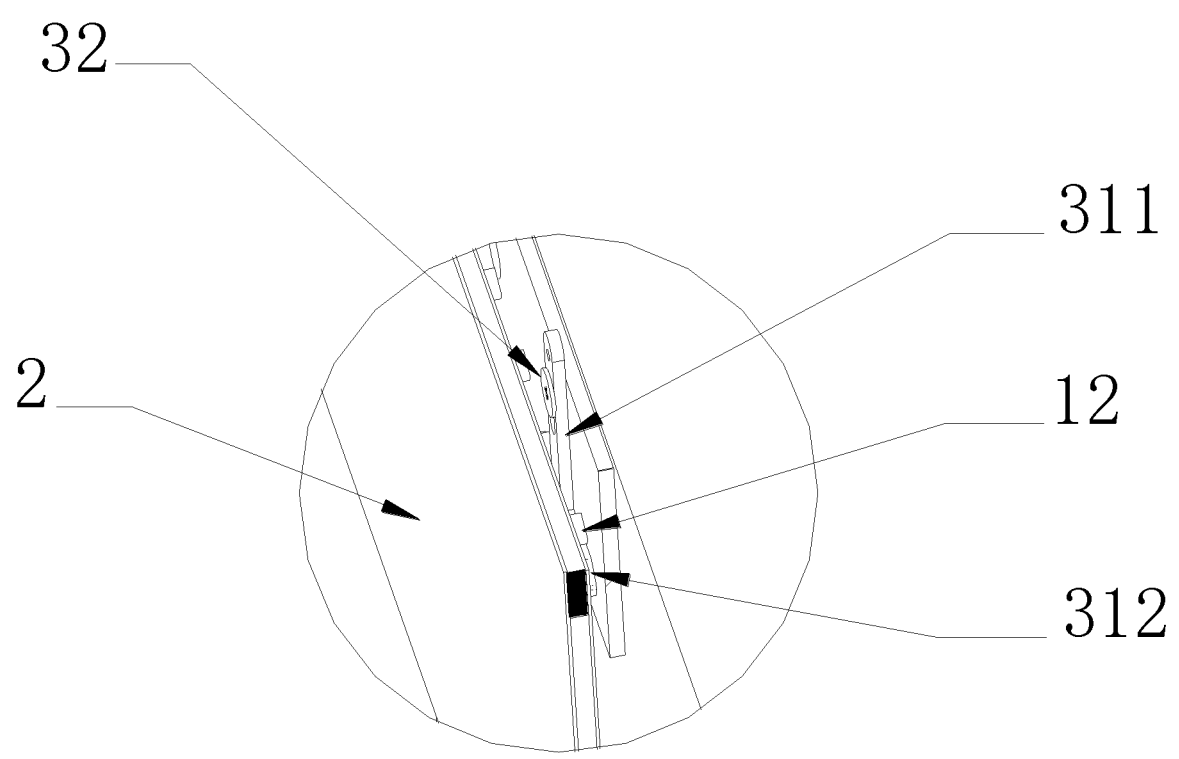
FIG. 5 is an enlarged view of portion A shown in FIG. 4.
Figure 6:
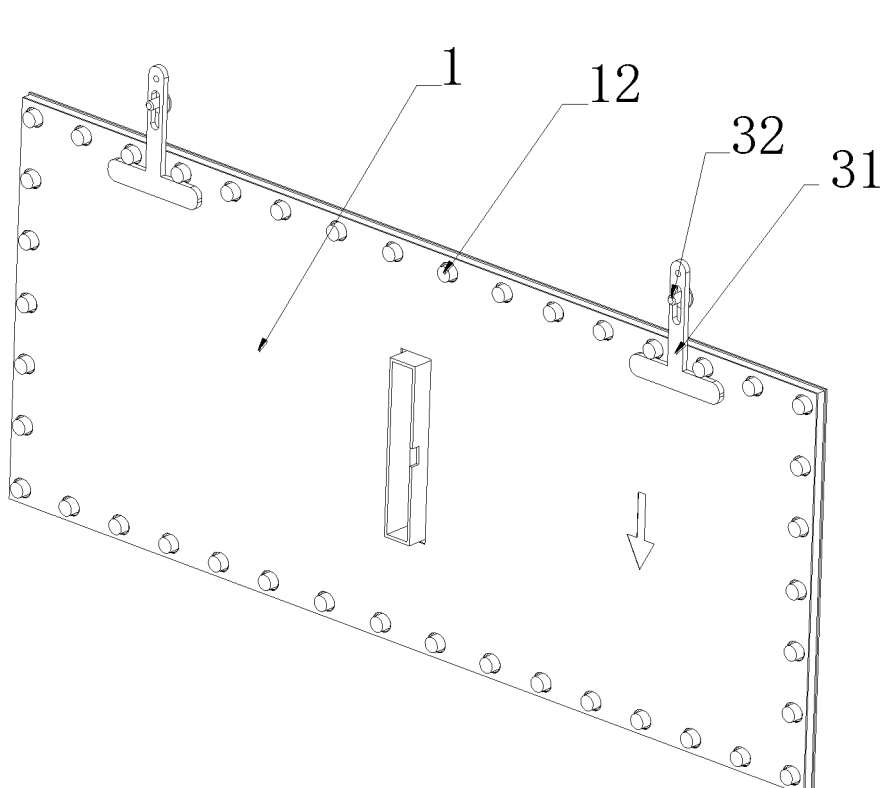
FIG. 6 is a perspective view of the LED module thereof (including the carrier assembly).

Referring to FIG. 3 and FIG. 5, the connecting plate 311 is located between two magnetic columns 12 along a horizontal direction, one side of the carrier plate 312 facing the connecting plate 311 is in close contact with the two magnetic columns 12. This means that the connecting plate 311 passes between two magnetic columns 12, and the carrier plate 312 supports the magnetic columns 12.

In the embodiment, referring to FIG. 1 and FIG. 5, the number of the carrier assemblies 3 is two, carrier assemblies 3 comprises a first carrier assembly 33 and a second carrier assembly 34, and the two carrier assemblies 3 are respectively located at a perimeter corner above the rectangular-shaped through holes 11. That is to say, the first carrier assembly 33 and the second carrier assembly 34 are respectively located above the two corners on the same straight line as the rectangular-shaped through holes 11. It ensures that the LED module 2 will not be offset and saves costs by supporting the magnetic columns 12 that is inserted into both ends of the LED module 2.

It should be noted that in the embodiment, LED module 2 is fixed to the magnetic columns 12 through adhesive bonding.

Furthermore, referring to FIG. 3, the connecting plate 311 is also provided with an auxiliary hole 3112, the auxiliary hole 3112 is located between the top of the fixed slot 3111 and the connecting plate 311. It is mainly used for the external operator to hook the connecting plate 311, which also means that the operator can control the T-shaped aluminum sheet 31, which is convenient for positioning screw 32 to fix the T-shaped aluminum sheet 31 on the cabinet 1, that is, tighten the positioning screw 32.

Furthermore, both ends of the carrier plate are in arc shape to avoid damage to the cabinet 1.

In this embodiment, the positioning screw 32 is M3 screw. The threaded hole is a screw hole suitable for M3 screws. Certainly, in other embodiments, the positioning screw 32 can also use other types of screws, which are convenient for operators to tighten and have strong toughness.

Further description of the specific operating principle of the present disclosure, firstly, attach all required T-shaped aluminum sheets 31 onto the threaded holes on the cabinet 1 with positioning screws 32; the carrier plate 3 of the T-shaped aluminum sheet 31 is near the rectangular-shaped through hole 11; secondly, face the LED module towards the rectangular-shaped through hole 11 on the cabinet 1; then attach the magnetic columns 12 of the LED module 2 to the cabinet 1, so that both sides of the lower end of the T-shaped aluminum sheet 31 are located below the two adjacent magnetic columns 12 on the upper part of the LED module 2; thirdly, loosen the positioning screw 32 slightly, insert an auxiliary tool into the auxiliary hole 3112 on the T-shaped aluminum sheet 31 and lift it upwards, so that both sides of the lower end of the T-shaped aluminum sheet 31 are in close contact with the two magnetic columns 12 above them; then tighten the positioning screw 32 and fix the T-shaped aluminum sheet 31 to the cabinet 1 stably to ensure that the T-shaped aluminum sheet 31 will not slide downward from the cabinet 1. It is obvious that the above the carrier assembly 3 is easy to install and operate, and can prevent the magnetic columns 12 from tilting down without the need for multiple tools, thereby stabilizing the position of the LED module 2.

Above are only preferred embodiments of the present disclosure and are not intended to limit the present disclosure. Any modification, equivalent replacement and improvement made within spirit and principle of the present disclosure should be included in protection scope of the present disclosure.

What is claimed is:

1. A device to prevent LED module from being slipped downward, comprising:

a cabinet, a LED module and a plurality of carrier assemblies;

the cabinet is made of SPCC and is used to adsorb other structures; the cabinet is provided with a plurality of horizontally distributed rectangular-shaped through holes;

several magnetic columns are fixedly connected around the periphery of the LED module, and one end of the magnetic column that is far away from the LED module is adsorbed on the cabinet; the LED module is arranged opposite to the rectangular-shaped through holes;

each carrier assembly comprises a T-shaped aluminum sheet and a positioning screw; the upper end of the T-shaped aluminum sheet is provided with a fixed slot; the cabinet is equipped with a threaded hole corresponding to the fixed slot; the positioning screw is threaded through the fixed slot and connected with the threaded hole for fixing the T-shaped aluminum sheet on the cabinet, both sides of the lower end of the T-shaped aluminum sheet are located below the two magnetic columns in a horizontal direction on the LED module for avoiding downward sliding of the magnetic columns.

2. The device to prevent LED module from being slipped downward of claim 1, wherein the T-shaped aluminum sheet comprises a connecting plate and a carrier plate integrally formed with the connecting plate, the carrier plate and the connecting plate are perpendicular to each other; the fixed slot is located at one end of the connecting plate away from the carrier plate.

3. The device to prevent LED module from being slipped downward of claim 2, wherein the fixed slot is a long groove arranged along the length direction of the connecting plate.

4. The device to prevent LED module from being slipped downward of claim 3, wherein the connecting plate is located between two magnetic columns along a horizontal direction, one side of the carrier plate facing the connecting plate is in close contact with the two magnetic columns.

5. The device to prevent LED module from being slipped downward of claim 2, wherein the connecting plate is also provided with an auxiliary hole, the auxiliary hole is located between the top of the fixed slot and the connecting plate.

6. The device to prevent LED module from being slipped downward of claim 2, wherein both ends of the carrier plate are in arc shape.

7. The device to prevent LED module from being slipped downward of claim 2, wherein the positioning screw is M3 screw.

8. The device to prevent LED module from being slipped downward of claim 2, the number of the carrier assembly is two, and the two carrier assemblies are respectively located at a perimeter corner above the rectangular-shaped through holes.

9. An assembly method of the device to prevent LED module from being slipped downward comprising the following steps:

(a) attach all required T-shaped aluminum sheets onto the threaded holes on the cabinet with positioning screws; the carrier plate of the T-shaped aluminum sheet is near the rectangular-shaped through hole;

(b) face the LED module towards the rectangular-shaped through hole on the cabinet; then attach the magnetic columns of the LED module to the cabinet, so that both sides of the lower end of the T-shaped aluminum sheet are located below the two adjacent magnetic columns on the upper part of the LED module;

(c) loosen the positioning screw slightly, insert an auxiliary tool into the auxiliary hole on the T-shaped aluminum sheet and lift it upwards, so that both sides of the lower end of the T-shaped aluminum sheet are in close contact with the two magnetic columns above them; then tighten the positioning screw and fix the T-shaped aluminum sheet to the cabinet stably to ensure that the T-shaped aluminum sheet will not slide downward from the cabinet.

10. The assembly method of the device to prevent LED module from being slipped downward of claim 9, wherein the auxiliary tool comprise tweezer.

\* \* \* \* \*